United States Patent [19]

Shii et al.

[11] Patent Number: 4,945,237
[45] Date of Patent: Jul. 31, 1990

[54] TRANSMISSION ELECTRON MICROSCOPE

[75] Inventors: Kazuo Shii, Ibaraki; Toshiyuki Ohashi, Katsuta; Hiroyuki Kobayashi, Mito, all of Japan

[73] Assignee: Hitachi, Ltd., Tokyo, Japan

[21] Appl. No.: 343,750

[22] Filed: Apr. 27, 1989

[30] Foreign Application Priority Data

Apr. 28, 1988 [JP] Japan ................... 63-106195

[51] Int. Cl.$^5$ ................ H01V 37/27; H01V 37/295
[52] U.S. Cl. ........................... 250/311; 250/307
[58] Field of Search .................... 250/311, 307

[56] References Cited

U.S. PATENT DOCUMENTS 4,068,123  1/1978  Kokubo ..................... 250/311
4,379,231  4/1983  Shii et al. .................. 250/311

OTHER PUBLICATIONS

Meakin et al., The Review of Scientific Instruments, vol. 36, No. 5, May 1965, pp. 654–656.

Primary Examiner—Jack I. Berman
Attorney, Agent, or Firm—Antonelli, Terry, Stout & Kraus

[57] ABSTRACT

Provided is an electron microscope having an electron gun emitting an electron beam onto a specimen to be observed, so as to produce transmitted main electron rays, inelastic scattering electron rays and diffractive scattering rays, an objective lens converging the electron rays so as to form an image, an objective aperture for normally cutting off the diffractive scattering electron rays while allowing the transmitted main electron rays and the inelastic scattering electron rays to pass therethrough, a magnifying means for magnifying the image, an observing screen from which the magnified image is visible, a mechanism for deflecting the electron beam emitted from the electron gun before the specimen, and a means for controlling the mechanism to deflect the electron beam to a large deflecting angle so as to cut off the main transmitted electron rays and the inelastic scattering electron rays at the objective aperture while allowing the diffractive scattering electron rays to enter into the magnifying lens through the objective aperture so as to form a dark field image having high contrast, whereby the focusing is made while observing the dark field image.

8 Claims, 3 Drawing Sheets

POSITION OF IRRADIATION BY ELECTRON BEAM ON SPECIMEN

TRANSMISSION ELECTRON MICROSCOPE

The present invention relates to a transmission electron microscope, and more particularly, to a transmission electron microscope in which focusing and correction for astigmatism can be readily performed.

In a transmission electron microscope, an electron beam emitted from an electron gun is applied to a specimen through an irradiation system, and the electron beam which has transmitted through the specimen is refracted through an image forming system and is then projected onto a viewing screen to form an enlarged image of the specimen thereon, thus contributing to observation of the specimen. When passing through the specimen, electron rays which constitute the electron beam act on atoms and electrons composing the specimen so as to be divided into three groups including transmitted main electron rays, diffractive scattering electron rays and inelastic scattering electron rays. These electron rays are refracted by an objective pole piece which plays a role of an objective lens such as to form an image on a focal plane thereof. However, since the above diffractive scattering electron rays alone are cut off by an objective aperture provided forwardly of the objective lens, a light field image is formed on the focal plane by the transmitted main electron rays and the inelastic scattering electron rays, which light field image is given with a contrast corresponding to the amount of diffractive scattering electron rays cut off by the objective aperture.

The image forming system is made up of a focusing objective lens, an intermediate lens for changing the magnification, and a projector lens for projecting the electron beam onto the viewing screen.

In case of observing a specimen with an electron microscope, it is necessary to make focusing by operating the objective lens so as to form an image on the focal plane thereof. Also, due to the astigmatism which is present in the image forming system, focusing becomes important even in making correction for astigmatism. Such correction for astigmatism is performed by means of an objective lens astigmatism correcting apparatus provided in the image forming system. In order to facilitate focusing, it is preferable to enlarge what is called "blur". Namely, it is preferable to increase the ratio of the amount of blur to the amount of operation of the objective lens. In U.S. Pat. No. 4,379,231 filed by the present applicants, it has been proposed that, in order to increase the amount of the above blur, an electron beam applied to a specimen is made to perform a hollow cone motion or a wobbler motion so as to enlarge an incident angle of the electron beam incident from the objective lens onto the focal plane. Namely, it is designed that, by enlarging the incident angle of the electron beam incident onto the focal plane, the amount of the blur is increased even when a focus is slightly deviated from the focal plane, thereby making it possible to judge whether it is in focus or not without difficulty.

In the above prior art, a light field image is used as an observed image in making focusing and correction for the astigmatism. Contrast in the light field image is not so high because it depends upon the amount only of the electron rays corresponding to the diffractive scattering electron rays described above. For this reason, in case of making focusing and correction for astigmatism while observing such a light field image, highly skilled handling technique is required for an operator. Further, in order to obtain a light field image, it is necessary to set the diameter of the objective aperture such as to allow only both above-described transmitted main electron rays and inelastic scattering electron rays to pass therethrough, resulting in inferior manipulability.

An object of the present invention is to provide an arrangement which can eliminate the above-described defects encountered in making focusing of a conventional transmission electron microscope, that is, to obtain an observed image having a high contrast in making focusing so as to facilitate focusing and correction for astigmatism.

In order to attain the above object, the present invention provides a transmission electron microscope which comprises an electron gun for emitting an electron beam to a specimen, an objective aperture for cutting of diffractive scattering electron rays alone other than transmitted main electron rays and inelastic scattering electron rays which are produced as a result of transmission of the electron beam through the specimen, an objective lens for converging the electron rays having passed through the objective aperture, means for magnifying and observing the electron rays converged through the objective lens, and deflecting means for controlling an incident angle of the electron beam incident onto the specimen, and which electron microscope further comprises control means for controlling the deflecting means to make adjustment of the incident angle of the electron beam incident onto the specimen so that the transmitted main electron rays and the inelastic scattering electron rays are cut off by the objective aperture while the diffractive scattering electron rays alone are allowed to pass through the objective aperture, thereby making focusing while observing a dark field image formed by the diffractive scattering electron rays and having a high contrast through the magnifying and observing means.

Specifically speaking, according to the present invention, the incident angle is set to be an angle greater than an aperture angle $2\alpha$ which is determined by the converging power of the objective lens and the aperture diameter of the objective aperture so that the diffractive scattering electron rays alone are allowed to pass through the objective aperture.

Furthermore, in order to attain the above object, the present invention provides a method for focusing a transmission electron microscope having an electron gun for emitting an electron beam to a specimen, an objective aperture for cutting off diffractive scattering electron rays alone other than transmitted main electron rays and inelastic scattering electron rays which are produced as a result of transmission of the electron beam through the specimen, an objective lens for converging the electron rays having passed through the objective aperture, means for magnifying and observing the electron rays converged through the objective lens, and deflecting means for controlling an incident angle of the electron beam incident onto the specimen, which method comprises the steps of controlling the deflecting means to deflect the electron beam emitted from the electron gun so as to cut off the transmitted main electron rays and the inelastic scattering electron rays by means of the objective aperture but allow the diffractive scattering electron rays alone to pass through the objective aperture, and making focusing while observing a dark field image formed by the diffractive scattering electron rays and having a high contrast through the observing means.

Other objects, features and advantages of the present invention will be made apparent from the following description given in conjunction with the accompanying drawings in which.

Figure 1:
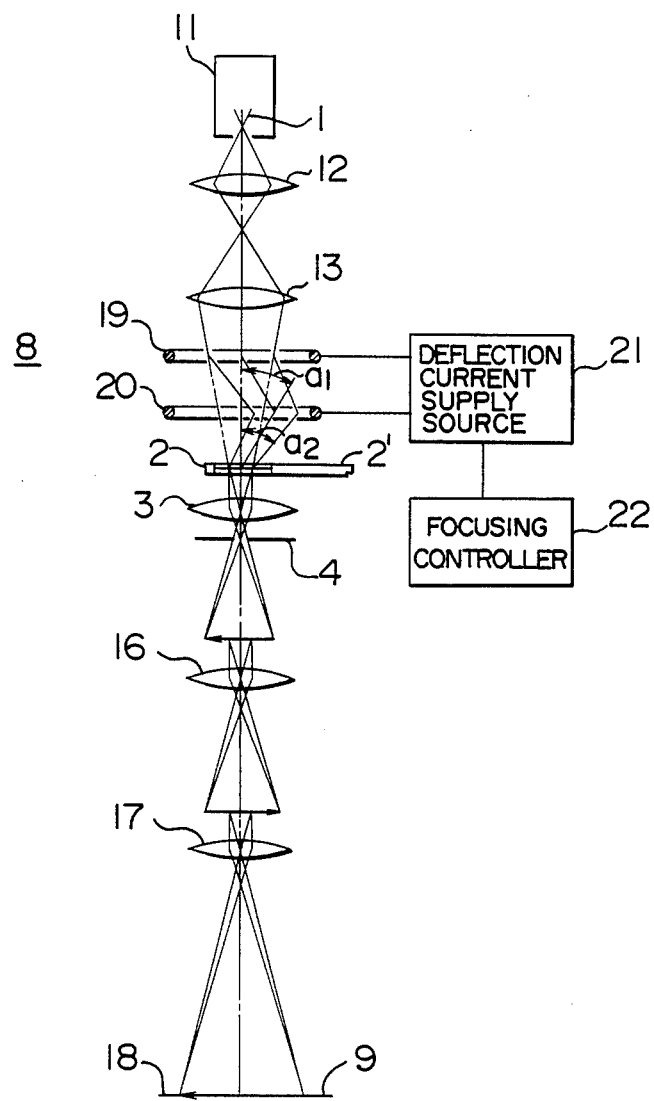
FIG. 1 is a conceptional view of an equivalent optical system of a transmission electron microscope with which the present invention is put into practice.

First, a transmission electron microscope with which the present invention is put into practice will be described with reference to FIG. 1. An electron beam emitted from an electron gun 11 is converged by a converging lens system made up of first and second converging lenses 12 and 13, and then applied to a specimen 2 carried by a specimen retainer 2'. The electron beam having transmitted through the specimen is turned into inelastic scattering electron rays 7, transmitted main electron rays 6 and diffractive scattering electron rays 5 (see FIG. 5), which electron rays are magnified by an image forming and magnifying lens system made up of an objective lens 3, an intermediate lens 16 and a projector lens 17, and are then projected onto a viewing screen 18 to form an image of the specimen 2 on the screen.

Between the second converging lens 13 and the specimen are disposed first and second deflectors 19 and 20 which are connected to a deflection current supply source 21. Detailed description of these deflectors 19 and 20 is given in the above-mentioned U.S. Pat. No. 4,379,231. These deflectors 19 and 20 and the deflection current supply source 21 cooperate with each other to constitute an electron beam deflecting and rotating apparatus.

Figure 2:
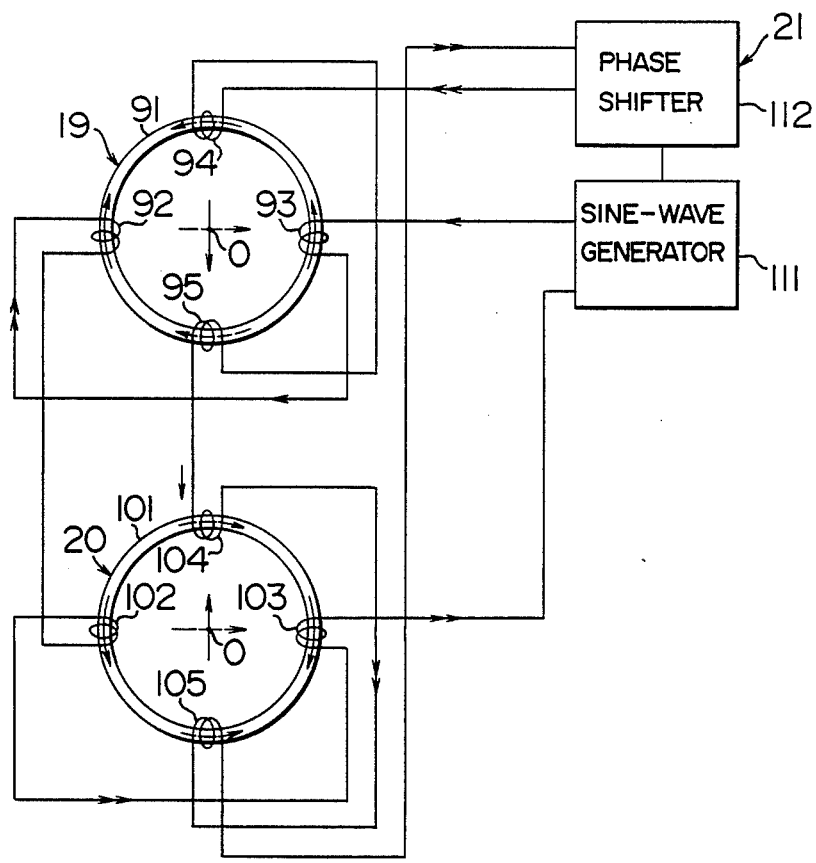
FIG. 2 is a conceptional view showing an electron beam deflecting and rotating apparatus shown in FIG. 1.

FIG. 2 shows the details of the electron beam deflecting and rotating apparatus. The first and second deflectors 19 and 20 are provided respectively with circular cores 91 and 101 each with the center thereof on an axis 0 along which the electron beam travels. Two pairs of coils 92, 93 and 94, 95, and 102, 103 and 104, 105 are wound around the cores 91 and 101, respectively, such as to be arranged substantially orthogonally. Namely, assuming that the orthogonal directions coincide with the X-coordinate axis and the Y-coordinate axis, the coils 92, 93, 102 and 103 are the coils of the X-axis system, while the coils 94, 95, 104 and 105 are the coils of the Y-axis system.

The deflection current supply source 21 is made up of a sine-wave generator 111 for generating a sine-wave alternating current and a phase shifter 112 for shifting the sine-wave alternating current generated by the sine-wave generator 111 by 90° in phase.

By virtue of the above electron beam deflecting and rotating apparatus, the magnetic field can be deflected and rotated in a certain direction. In other words, this apparatus enables the electron beam 1 emitted from the electron gun 11 to be deflected and rotated before it reaches the specimen 2. More specifically, if the electron beam 1 is deflected in a certain direction with the deflection angle being thereof varied continuously, the electron beam 1 performs a wobbler motion, while if the electron beam is deflected and then rotated, the electron beam 1 performs a hollow cone motion.

Referring to FIG. 1, a focusing controller 22 is connected to the deflection current supply source 21 mentioned above.

The focusing controller 22 controls the deflection current supply source 21 such as to deflect the electron beam 1 emitted from the electron gun to a large deflecting angle, and is therefore an indispensable constituent of the present invention. Description will be made later in this respect.

Figure 5:
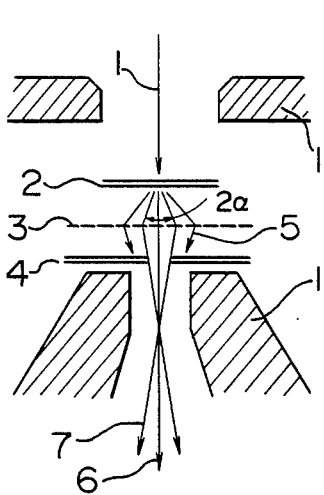
FIG. 5 is a schematic sectional view for explanation of the behavior of the electron beam in the electron microscope.

In order to facilitate the understanding of the present invention, the contrasts of a light field image and of a dark field image formed by the transmission electron microscope will be explained with reference to FIGS. 5 and 6.

As mentioned before, when the electron beam 1 emitted from the electron gun 11 has transmitted through the specimen 2, three kinds of electron rays, that is, the transmitted main electron rays 6, the diffractive scattering electron rays 5 and the inelastic scattering electron rays 7, are produced owing to the interaction between atoms and electrons within the specimen 2. These electron rays are refracted through a principal plane of the objective lens 3 of the objective pole piece 10 which constitutes the objective lens. The objective aperture 4 cuts off the diffractive scattering electron rays 5 out of the above-mentioned electron rays so as not to allow them to pass through the image forming and magnifying lens system. In consequence, an image 9 to be observed, formed on the viewing screen 18 is a light field image obtained by the transmitted main electron rays 6 and the inelastic scattering electron rays 7. The light field image thus obtained has a contrast given in correspondence to the amount of the cut-off diffractive scattering electron rays 5.

Figure 6:
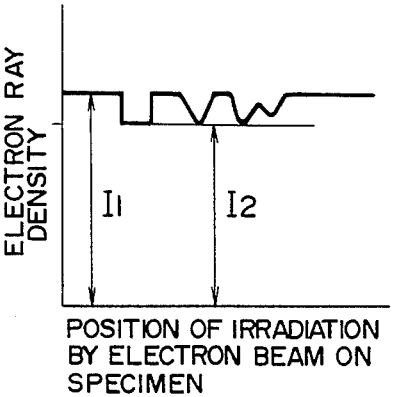
FIG. 6 is a diagrammatic view for explanation of the definition of the contrast in the electron microscope.

FIG. 6 is a view for explaining the cause for the appearance of the contrast, in which the ordinate represents the electron density of the electron beam applied to the specimen and the abscissa represents the position on the specimen to which the electron beam is applied.

As described above, the image to be observed, obtainable according to the prior art is a light field image having a contrast given in correspondence to the amount of the diffractive scattering electron rays which have been cut off, which contrast can be expressed as follows.

Namely, assuming generally that the sum of the electron density of the transmitted electron rays 6 and that of the diffractive scattering electron rays 5 is represented by $I_1$ and the electron density of the transmitted main electron rays 6 alone is represented by $I_2$, a contrast C in the light field image as the observed image 9 is obtained in accordance with the following formula:

$$C = (I_1 - I_2)/\{(I_1 + I_2)/2\} \ldots \ldots \quad (1)$$

According to the above formula, it is understood that the contrast can be enhanced by lowering the electron density $I_2$ of the transmitted main electron rays 6 to zero.

In other words, an image formed on the viewing screen 18 by the diffractive scattering electron rays 5 alone, that is, a dark field image, has a high contrast although the brightness thereof is made lower, so that utilization of such dark field image makes it possible to facilitate focusing of the electron microscope.

Incidentally, the electron density of the diffractive scattering electron rays 5 is affected remarkably by the material (atomic number) and the thickness of the specimen. However, the image to be observed formed as the dark field image generally appears to be clear since it has a higher contrast as compared with that of the light field image. It is therefore possible to make focusing and correction for astigmatism accurately and readily by utilizing the dark field image.

Further, by causing the electron beam 1 to perform the hollow cone motion, the amount of blur of the image in making focusing can be increased and the dark field image in every direction can be observed at a time, and therefore, focusing and correction for astigmatism can be made further accurately and easily.

Figure 3:
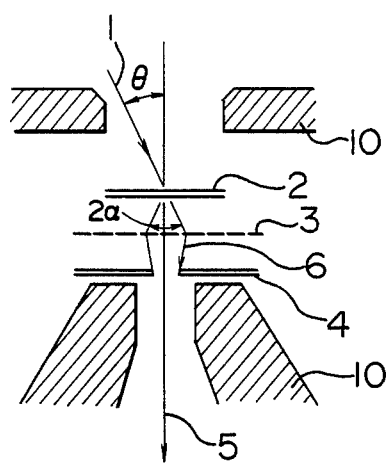
FIG. 3 is a schematic sectional view showing a first embodiment of the present invention.

FIG. 3 shows a first embodiment of the present invention, which is a partly sectional view of an electron microscope. In this figure, the identical component parts as those shown in FIGS. 1 and 5 are denoted by the identical reference numerals, respectively, for the convenience of avoiding unnecessary repetition of the description.

In FIG. 3, an aperture angle $2\alpha$ is a maximum angle within which the electron rays can be scattered from the specimen 2 so as to be allowed to pass through the objective aperture 4 through the objective lens 3. The aperture angle is determined by the aperture diameter of the objective aperture 4 and the converging power of the objective lens 3. Therefore, the electron rays scattered at smaller angles than the aperture angle $2\alpha$ participate in forming the image after passing through the objective aperture 4, while the other remainder electron rays are cut off by the objective aperture 4.

In the present embodiment, the incident angle $\theta$ of the electron beam 1 applied to the specimen 2 is set to be greater than one-half of the aperture angle $2\alpha$ so that the transmitted main electron rays 6 are cut off by the objective aperture 4 and, only the diffractive scattering electron rays 5 are substantially allowed to pass through the objective aperture 4.

Namely, according to the present embodiment, since the image to be observed used in making focusing and correction of astigmatism is given as a dark field image formed substantially by the diffractive scattering electron rays 5, the contrast in the observed image is high, resulting in that focusing and correction for astigmatism can be made accurately and easily.

Figure 4:
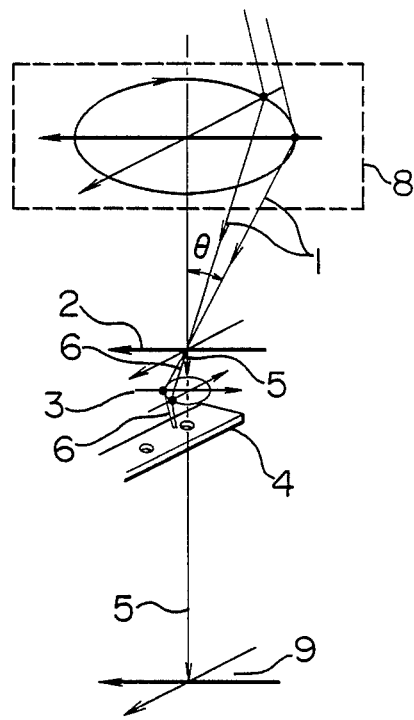
FIG. 4 is a schematic sectional view showing a second embodiment of the present invention.

FIG. 4 is an illustration for explaining the arrangement of an electron microscope according to another embodiment of the present invention, in which the same reference numerals and characters as those in FIGS. 1 and 3 denote the identical or corresponding parts, respectively.

In this embodiment, the electron beam 1 applied to the specimen 2 is deflected by means of an electron beam deflecting mechanism 8 provided above the specimen 2 to such an extent that the main electron rays 6 and the inelastic scattering electron ray 7 are cut off by the objective aperture 4. That is, as described before in conjunction to FIG. 1, the incident angle $\theta$ of the electron beam 1 incident onto the specimen 2 is set to be greater than one-half of the aperture angle $2\alpha$ of the objective lens 3. By so doing, the diffractive scattering electron rays 5 alone are substantially allowed to pass through the objective aperture 4 so as to form a dark field image in one direction. In this condition, if, by controlling the electron beam deflecting mechanism 8, the incident electron beam 1 is made to perform a hollow cone motion about a point on the specimen in symmetric manner with respect to an optical axis, the transmitted main electron rays 6 in all directions are cut off and, accordingly, a dark field image can be formed in every direction on the viewing screen 18.

In addition, since observation of the astigmatism of the objective lens needs to observe the image in all directions at a time, it is necessary to cause the incident electron beam 1 to perform the hollow cone motion at the high speed more than several tens Hz. Further, since a plurality of holes with different diameters are formed in the objective aperture 4, it is necessary to change each time the incident angle $\theta$ of the electron beam 1. In consequence, it is preferable to design the electron beam deflecting mechanism 8 such as to be able to set the frequency of the hollow cone motion and the incident angle $\theta$ at desired values.

According to the present embodiment, the contrast of the image to be observed can be enhanced and even a small amount of blur of the image in a certain direction caused due to the astigmatism of the objective lens can be observed, and therefore, it becomes possible to make focusing and correction for the astigmatism of the objective lens accurately and easily.

In the embodiment described above, the electron beam 1 has been described as one which performs the hollow cone motion for the purpose of enlarging the blur of the observed image. However, this is not limitative to the present invention and the electron beam 1 can be allowed to perform, for example, a wobbler motion, provided that the amount of blur of a dark field image which is formed substantially by the diffractive scattering electron rays 5 alone while cutting off the transmitted main electron rays 6, can be enlarged.

As clearly seen from the foregoing description, according to the present invention, the following advantages can be attained.

By cutting off the transmitted main electron rays, it is possible to obtain a dark field image of high contrast which image is formed substantially by the diffractive scattering electron rays alone, so that it is possible to make focusing and correction for astigmatism accurately and easily by making use of the dark field image.

The electron beam applied to the specimen is caused to perform the wobbler motion so as to increase the amount of blur of the observed image used in making focusing and correction for astigmatism, and therefore, it becomes possible to make focusing and correction for astigmatism further accurately and easily.

The electron beam applied to the specimen is caused to perform the hollow cone motion so as to make it possible to increase the amount of blur of the observed image used in making focusing and correction for the astigmatism and form a dark field image in every direction, and therefore, it becomes possible to make focusing and correction for astigmatism still more accurately and easily.

Since the diffractive scattering electron rays alone are substantially allowed to pass through the objective aperture, it becomes possible to reduce the diameter of the holes of the objective aperture, resulting in the improvement in the operational performance.

The present invention has been described above in terms of the preferred embodiments. However, the present invention is not limited to the embodiments described above but various modifications can be made within the scope of the claimed invention.

What is claimed is:

1. An electron microscope comprising:
   means for generating an electron beam;
   means for causing the electron beam to impinge upon a specimen, said electron beam producing transmitted main electron rays, inelastic scattering electron rays and diffractive scattering electron rays after passing through said specimen;
   means for deflecting said electron beam before said electron beam impinges upon said specimen at a predetermined angle;
   objective lens means for converging said electron rays from said specimen so as to form an image;
   objective aperture means for normally cutting off said diffractive scattering electron rays so as to allow said transmitted main electron rays and said inelastic scattering electron rays to pass therethrough;
   means for magnifying said image;
   means for visually observing said magnified image; and
   means coupled to said deflecting means, for controlling said deflecting means so as to deflect said electron beam before said specimen to a large deflecting angle by which said transmitted main electron rays and said inelastic scattering electron rays are cut off at said aperture means while said diffractive scattering rays alone is allowed to enter into said magnifying means through said aperture means so as to form a dark field image having high contrast, thereby focusing is made while said dark field image is observed through said observing means.

2. An electron microscope as set forth in claim 1, wherein said deflecting angle is greater than one-half of an aperture angle of said objective lens means.

3. An electron microscope as set forth in claim 1, wherein said deflecting means allows said electron beam to perform a hollow cone motion about an axis passing through a point on said specimen.

4. An electron microscope as set forth in claim 1, wherein said deflecting means allow said electron beam to perform a wobbler motion.

5. A method of focusing an electron microscope having means for generating an electron beam, means for causing said electron beam to impinge upon a specimen so as to form transmitted main electron rays, inelastic scattering electron rays and diffractive scattering rays after said electron beam passing through said specimen, objective lens means for converging said electron rays so as to form an image, aperture means for normally cutting off said diffractive scattering rays while allowing said transmitted main electron rays and said inelastic electron rays to pass therethrough, means for magnifying said image and means for visually observing said magnified image; comprising the steps of:
   controlling said deflecting means to deflect said electron beam emitted from said generating means to a large deflecting angle, so as to cut off said transmitted main electron rays and said inelastic scattering electron rays but allow said diffractive scattering rays which therefore form a dark field image having a high contrast through said objective lens means; and
   observing said dark field image through said magnifying means and said visually observing means so as to focus said electron microscope.

6. A method of focusing an electron microscope as set forth in claim 5, wherein said deflecting angle is greater than one-half of an aperture angle of said objecting lens means.

7. A method of focusing an electron microscope as set forth in claim 5, wherein said electron beam is allowed to perform a hollow cone motion about an axis passing through a point on said specimen.

8. A method of focusing an electron microscope as set forth in claim 5, wherein said electron beam is allowed to perform a wobbler motion.

* * * * *